United States Patent
Morooka et al.

[11] Patent Number: 5,825,183
[45] Date of Patent: Oct. 20, 1998

[54] RADIAL DIFFERENTIAL SQUID MAGNETIC FLUX METER

[75] Inventors: Toshimitsu Morooka; Kazuo Chinone; Nobuhiro Shimizu, all of Chiba, Japan

[73] Assignee: Seiko Instruments Inc., Japan

[21] Appl. No.: 635,034

[22] Filed: Apr. 19, 1996

[30] Foreign Application Priority Data

May 22, 1995 [JP] Japan .................................. 7-122771

[51] Int. Cl.$^6$ ...................... G01R 33/035; G01R 33/02; G01N 27/72
[52] U.S. Cl. ...................... 324/248; 324/241; 324/258; 505/846
[58] Field of Search ................................ 324/239, 240, 324/241, 248, 258, 260; 505/162, 846; 128/653.1; 600/409

[56] References Cited

U.S. PATENT DOCUMENTS

| | | | |
|---|---|---|---|
| 5,038,104 | 8/1991 | Wikswo, Jr. et al. | 324/248 |
| 5,053,834 | 10/1991 | Simmonds | 324/248 X |
| 5,166,614 | 11/1992 | Yokosawa et al. | 324/248 |
| 5,289,121 | 2/1994 | Kajola et al. | 324/248 |
| 5,293,119 | 3/1994 | Podney | 324/248 X |
| 5,465,049 | 11/1995 | Matsuura et al. | 324/248 |
| 5,506,200 | 4/1996 | Hirschkoff et al. | 324/248 X |
| 5,596,273 | 1/1997 | Yabe et al. | 324/248 |

FOREIGN PATENT DOCUMENTS

| | | | |
|---|---|---|---|
| 4125087 | 2/1993 | Germany | 324/248 |
| 0083682 | 4/1988 | Japan | 324/248 |

*Primary Examiner*—Gerard R. Strecker
*Attorney, Agent, or Firm*—Adams & Wilks

[57] ABSTRACT

A superconducting loop is formed by two Josephson junctions connected to both ends of a washer coil which serves also as a pick-up coil. The washer coil which is a magnetic field detection portion is constituted by two coils, i.e., a coil having a radius $r_1$ and a number of turns $n_1$ and a coil having a radius $r_2$ and a number of turns $n_2$ which are in the form of concentric circular loops. The two coils are coupled in opposite directions and are designed so that effective areas $n_1 \pi r_1^2$ and $n_2 \pi r_2^2$ are equal to each other. Since a magnetic field is directly detected by the washer coil, sensitivity to a magnetic field is enhanced. This makes it possible to obtain sufficient sensitivity to a magnetic field even if the area of the magnetic field detection portion is reduced to improve spatial resolution. It is, therefore, possible to realize a radial differential SQUID magnetic flux meter which has good spatial resolution and coil balance and which is suitable for mass production.

13 Claims, 11 Drawing Sheets

RADIAL DIFFERENTIAL SQUID MAGNETIC FLUX METER

BACKGROUND OF THE INVENTION

The present invention relates to a radial differential superconducting quantum interference device magnetic flux meter (radial differential SQUID magnetic flux meter) utilizing a superconducting quantum interference device (hereinafter referred to as "SQUID") for the detection of microscopic magnetic fields such as that of biological magnetism and for non-destructive testing for inspecting defects, corrosion, and the like of metals on a non-destructive and non-contact basis.

Figure 10:
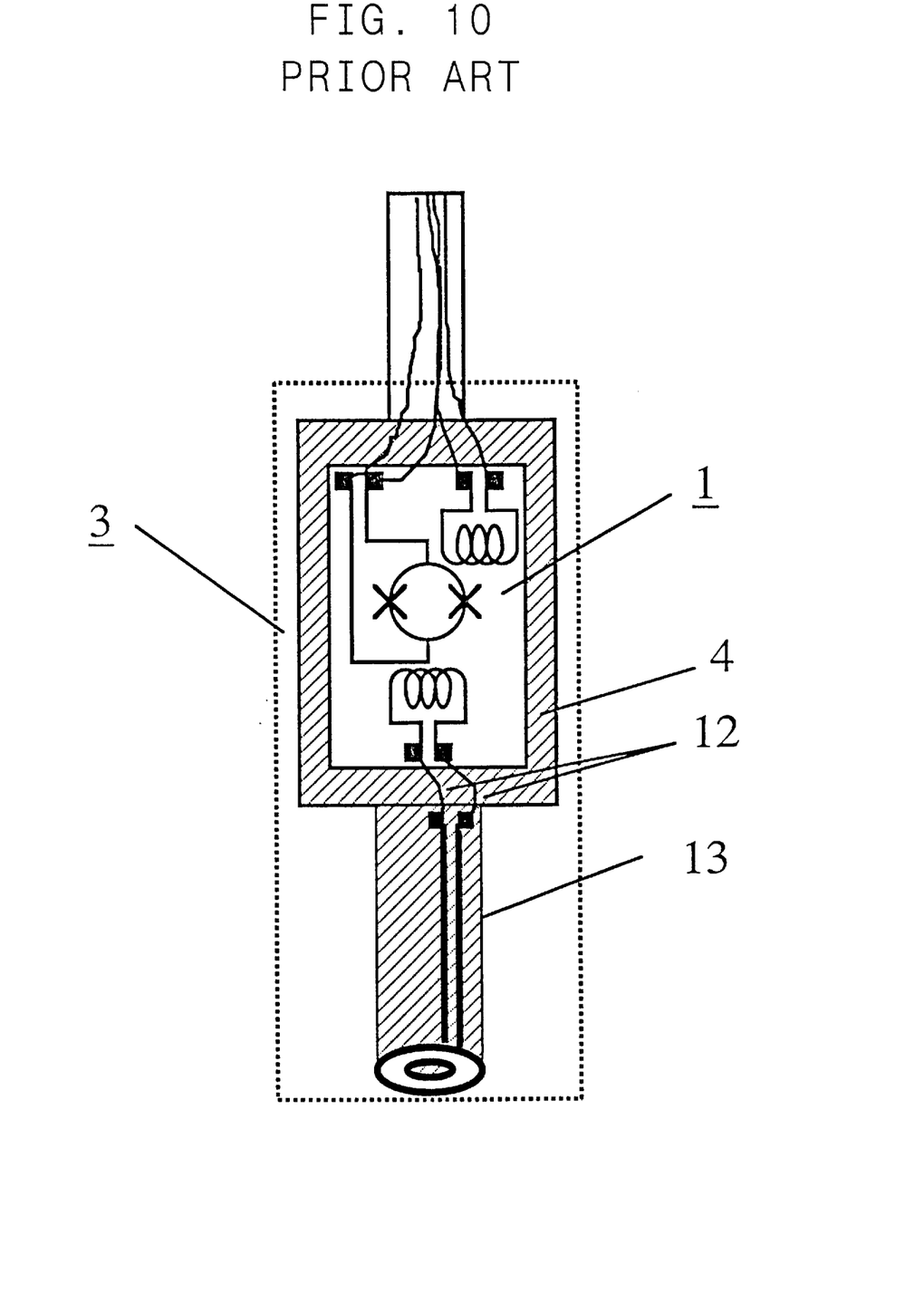
FIG. 10 is a configuration diagram of a radial differential SQUID magnetic flux meter illustrating the prior art.

FIG. 10 is a configuration diagram of a conventional radial differential SQUID magnetic flux meter, wherein 1 designates a SQUID; 13 designates a bobbin type pick-up coil; 3 designates a sensor unit; and 4 designates a superconducting shield element.

The sensor unit portion of the radial differential SQUID magnetic flux meter is formed by the SQUID 1 and the bobbin type pick-up coil 13.

Figure 11:
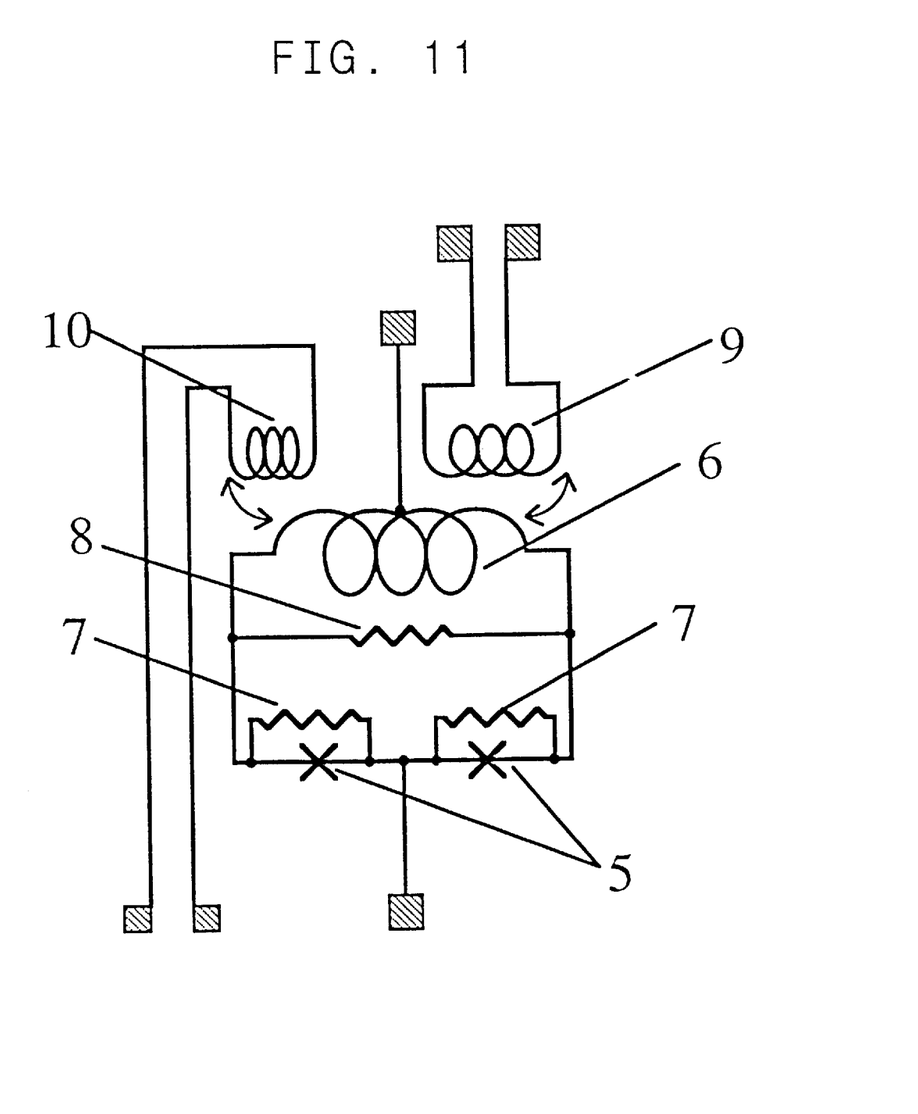
FIG. 11 is a basic equivalent circuit diagram of a SQUID.

FIG. 11 is an equivalent circuit diagram of the SQUID 1. A superconducting loop is formed by two Josephson junctions 5 connected to both ends of a washer coil 6. A shunt resistor 7 is connected to each Josephson junction 5 in parallel to eliminate hysteresis in current-voltage characteristics, and a damping resistor 8 is connected across the washer coil in parallel to suppress unnecessary resonance at the washer coil. The magnetic flux detected by the bobbin type pick-up coil 13 (FIG. 10) is input to the washer coil 6 through an input coil 9 which is magnetically coupled to the washer coil 6. Further, a feedback modulation coil 10 is magnetically coupled to the washer coil 6 to drive it using an FLL (flux-locked loop) circuit (not shown), thereby forming a DC-driven (DC) SQUID.

In FIG. 10, the bobbin type pick-up coil 13 is fabricated by manually winding a superconducting wire material such as Nb-Ti around a bobbin. The SQUID 1 and a bobbin type pick-up coil 13 are separately fabricated and, thereafter, the sensor unit 3 is formed by connecting the input coil 9 of the SQUID 1 and a connection portion of the pickup coil on a superconducting basis using a superconducting wire 12. Further, the SQUID 1 is contained in a superconductor shield element 4 to shield it from ambient noises by canceling a uniform component of a magnetic field and a first order component of the magnetic field.

Figure 12:
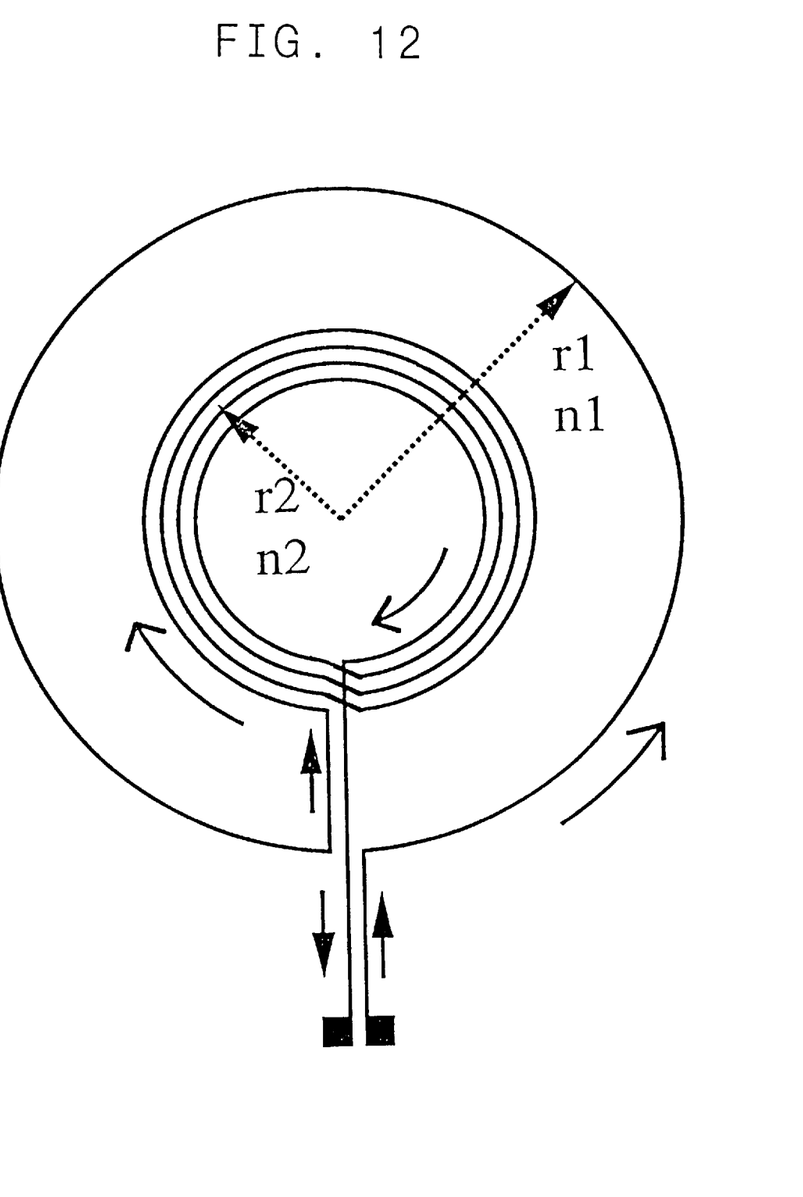
FIG. 12 shows a coil arrangement of a radial detection coil constituted by concentric circular loops.

A differential pick-up coil is normally used to eliminate ambient noises and background noises. FIG. 12 shows a coil arrangement of a radial differential pick-up coil.

The radial differential pick-up coil is constituted by two coils in the form of concentric circles. The two coils are coupled in opposite directions to nullify the sum of the magnetic flux detected in a uniform magnetic field, and their areas and numbers of turns are designed so that they will have equal effective areas. Specifically, a configuration as shown in this figure constituted by a coil having a radius $r_1$ and a number of turns $n_1$ and a coil having a radius $r_2$ and a number of turns $n_2$ is designed to satisfy $n_1 \pi r_1^2 = n_2 \pi r_2^2$.

Conventional radial differential SQUID magnetic flux meters have used a bobbin type pick-up coil obtained by manually winding a superconducting wire material such as Nb—Ti around a bobbin as a magnetic field detection coil. In order to obtain high spatial resolution, the sensor unit portion formed by the SQUID and magnetic field detection coil must be made compact. In the prior art, however, it has been difficult to obtain a high spatial resolution because the magnetic field detection coil of the sensor unit has had a large construction because of the bobbin used therein.

Another problem has arisen in that sufficient sensitivity can not be obtained if the magnetic field detection portion of the pick-up coil is made small to improve spatial resolution.

In addition, the effective areas of the two coils forming the radial differential detection coil have been made equal to each other to eliminate magnetic fields associated with ambient noises, background noises, and the like. In order to eliminate such ambient noises and background noises efficiently, it has been necessary to fabricate the above-mentioned two coils with accurate balance. However, the improvement in accuracy of balance has been limited because the fabrication of conventional bobbin type pick-up coils has involved manual winding.

There has been yet another problem in that the many manual operations included in the fabrication process have reduced productivity on a mass production basis.

SUMMARY OF THE INVENTION

It is an object of the present invention to provide a radial differential SQUID magnetic flux meter which has good spatial resolution and coil balance and which is suitable for mass production.

In order to achieve the above-described objects, a radial differential SQUID magnetic flux meter is provided which comprises two Josephson junctions, a washer coil which in combination with the Josephson junctions forms a superconducting loop, and a feedback modulation coil magnetically coupled to the washer coil, the washer coil is formed by concentric ring-shaped loops disposed on a flat surface, and the washer coil forms a magnetic field detection portion which directly detects a magnetic field.

Further, in a radial differential SQUID magnetic flux meter having two Josephson junctions, a washer coil which in combination with the Josephson junctions forms a superconducting loop, and a feedback modulation coil magnetically coupled to the washer coil, there is provided, as the magnetic field detection portion, a planar pick-up coil integrally formed by a plurality of concentric ring-shaped or polygonal-shaped loops on the same substrate as the SQUID.

The above-mentioned concentric ring-shaped loops forming a magnetic field detection portion may be constituted by a plurality of partial ring-shaped or polygonal-shaped loops. In this case, the partial ring-shaped loops are connected in series and/or in parallel to collectively form concentric ring-shaped loops.

Accordingly, the configuration of the concentric ring-shaped loops forming a magnetic field detection portion may be appropriately selected from different configurations such as circular ring-shaped loops or polygonal-shaped loops having centroids in the same position.

Among the radial differential SQUID magnetic flux meters having the above-described configurations, the type wherein a magnetic field is directly detected by a washer coil does not need an externally mounted pick-up coil and a superconducting shield for shielding the main body of the SQUID unlike the prior art. As a result, the sensor unit can be made compact, and sensitivity to a magnetic field can be further improved.

In the type wherein a planar pick-up coil is integrally formed on the same substrate as the SQUID, the sensor unit can be fabricated entirely from a superconducting thin film. This improves the balance of the coils.

DETAILED DESCRIPTION OF THE PREFERRED EMBODIMENTS

Embodiments of the present invention will now be described with reference to the drawings.

Figure 1:
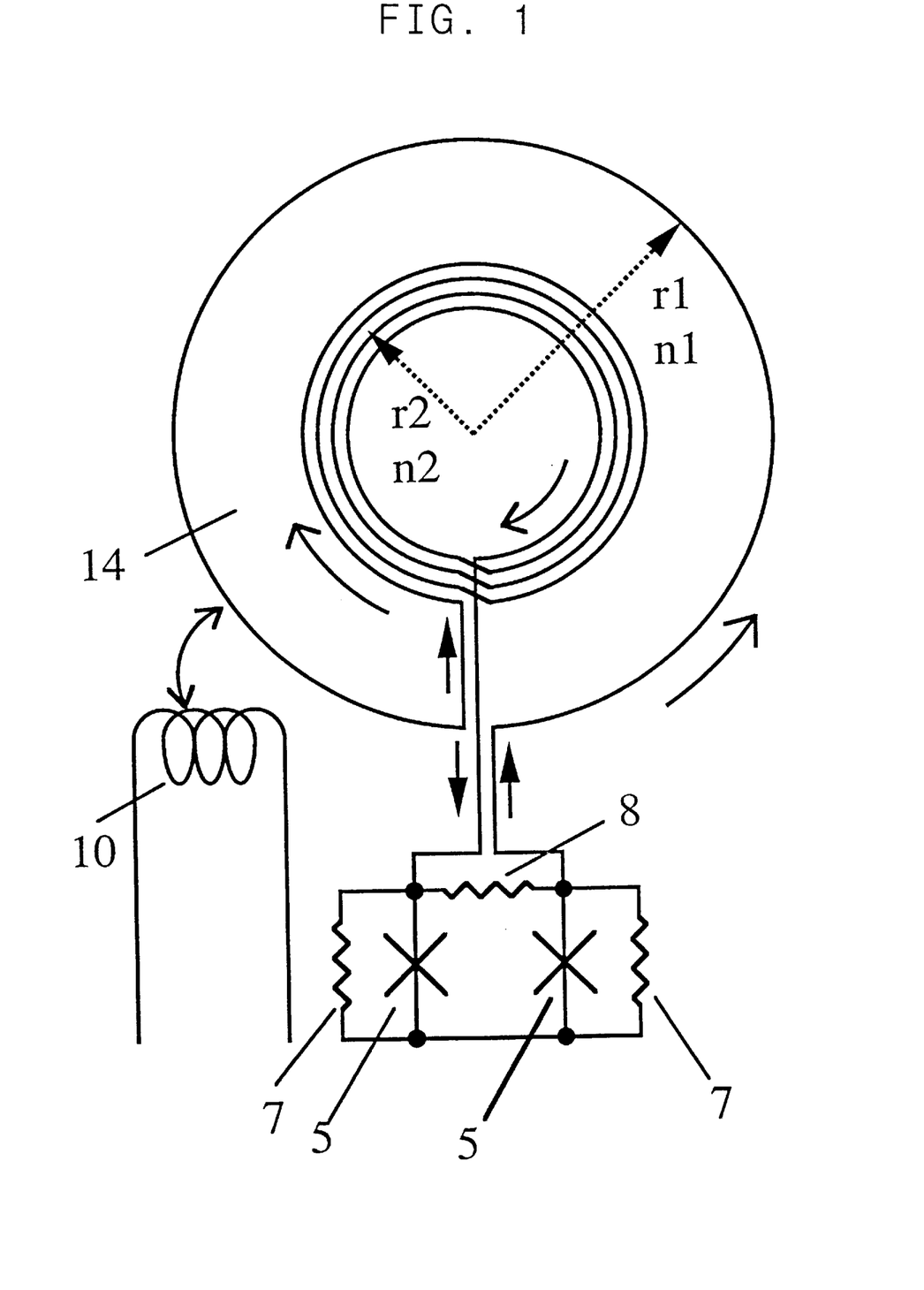
FIG. 1 is a configuration diagram of a radial differential SQUID magnetic flux meter illustrating a first embodiment of the present invention.

FIG. 1 is a configuration diagram of a radial differential SQUID magnetic flux meter illustrating a first embodiment of the present invention. This is a configuration wherein a magnetic field is directly detected by a washer coil 14 which serves also as a pick-up coil. This configuration as a whole is formed by integrating superconducting Nb thin films on the same silicon single crystal substrate.

A superconducting loop is formed by two Josephson junctions 5 connected to both ends of the washer coil 14 serving also as a pick-up coil. A shunt resistor 7 is connected to each Josephson junction 5 in parallel to eliminate hysteresis in current-voltage characteristics, and a damping resistor 8 is connected across the washer coil 14 in parallel to suppress unnecessary resonance at the washer coil 14. Further, a feedback modulation coil 10 is magnetically coupled to the washer coil 14 to drive it using an FLL (flux-locked loop) circuit not shown, thereby forming a DC SQUID.

The washer coil 14 which is a magnetic field detection portion is constituted by two circular coils, i.e., a circular coil having a radius $r_1$ and a number of turns $n_1$ and a circular coil having a radius $r_2$ and a number of turns $n_2$. The two coils are coupled in opposite directions and are designed so that effective areas $n_1 \pi r_1^2$ and $n_2 \pi r_2^2$ are equal to each other.

In FIG. 1, the number of turns $n_1$ of the circle having a radius $r_1$ is 1 while the number of turns $n_2$ of the circle having a radius $r_2$ is 4. Therefore, the design satisfies $r_1 = 2 \times r_2$. Since a magnetic field is directly detected by the washer coil 14, sensitivity to a magnetic field is enhanced, and sufficient sensitivity to a magnetic field can be obtained even if the area of the magnetic field detection portion is reduced to improve spatial resolution. Although the intervals between the windings of the coil having a radius $r_2$ are exaggerated in FIG. 1, when the coil is fabricated, the radius $r_2$ is about 1 mm while the width and interval of the windings are both about 5 μm. Therefore, the area of the coil will include only a negligible error even if the radius of the entire coil consisting of four windings is represented by the radius $r_2$.

Figure 2:
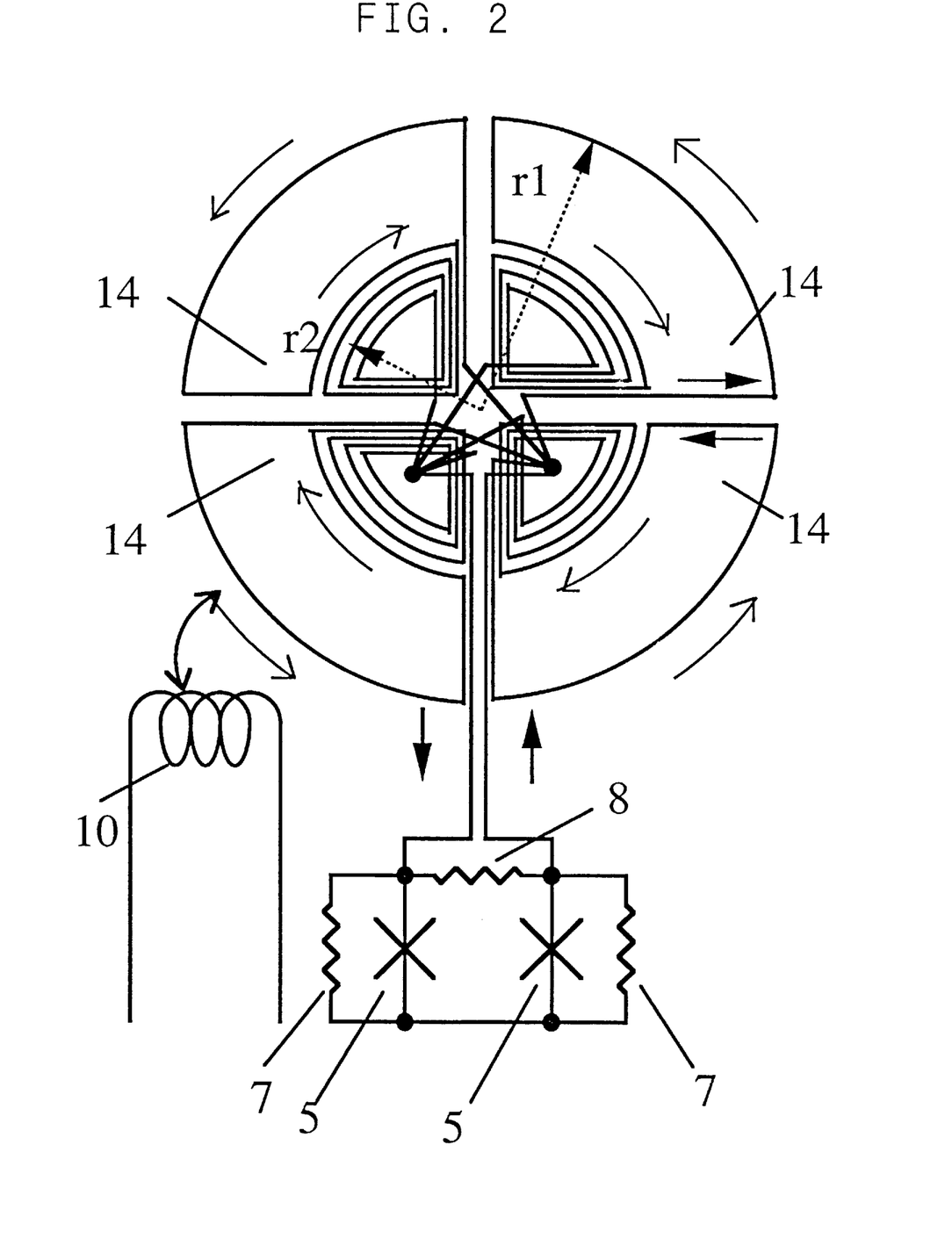
FIG. 2 is a configuration diagram of a radial differential SQUID magnetic flux meter illustrating a second embodiment of the present invention.
Figure 3:
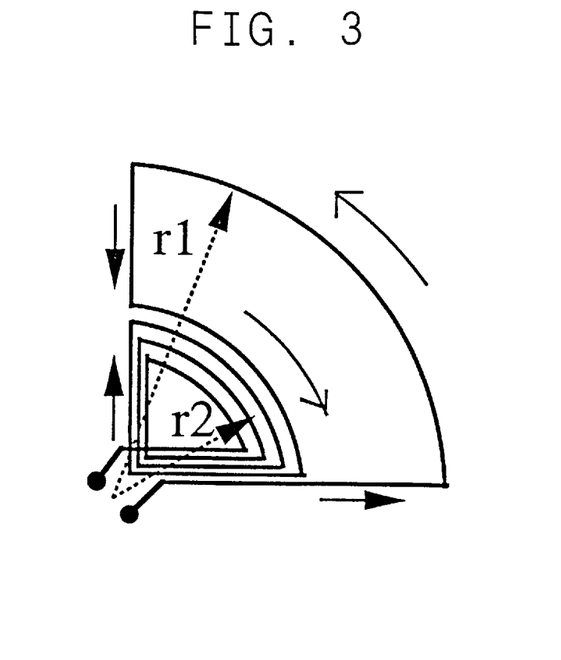
FIG. 3 illustrates loops forming the multi-loop shown in the second embodiment.

FIG. 2 is a configuration diagram of a radial differential SQUID magnetic flux meter illustrating a second embodiment of the present invention. A washer coil 14 which also serves as a pick-up coil has a multi-loop structure wherein four loops are connected in parallel. Each of the loops that form the multi-loop is constituted by one sector having a radius $r_1$ and four sectors having a radius $r_2$ which share a centroid in the same position as shown in FIG. 3 and which are series-connected in opposite directions. They are designed so that respective effective areas $\pi r_1^2 /4$ and $4 \times \pi r_2^2 /4$ are equal to each other, i.e., $r_1 = 2 \times r_2$. As apparent from FIG. 2, a circle having a radius $r_1$ and four circles each having a radius $r_2$ are made by combining four of the loops shown in FIG. 3. They collectively form a configuration equivalent to that of the washer coil shown in the first embodiment. The structure of the second embodiment having four parallel multiple loops allows the self-inductance of the washer coil 14 to be smaller than that of the first embodiment having the same radius.

Although the number of the parallel-connected loops is four and the central angle of the sectors is 90° in the second embodiment, the number of loops and the central angle of the sectors may be arbitrarily set. Further, although parallel connection is employed to reduce the self-inductance of the washer coil, series connection may be used instead. However, it is necessary that the sectors having a radius $r_1$ and the sectors having a radius $r_2$ are connected in opposite directions and are designed to have equal effective areas.

Figure 4:
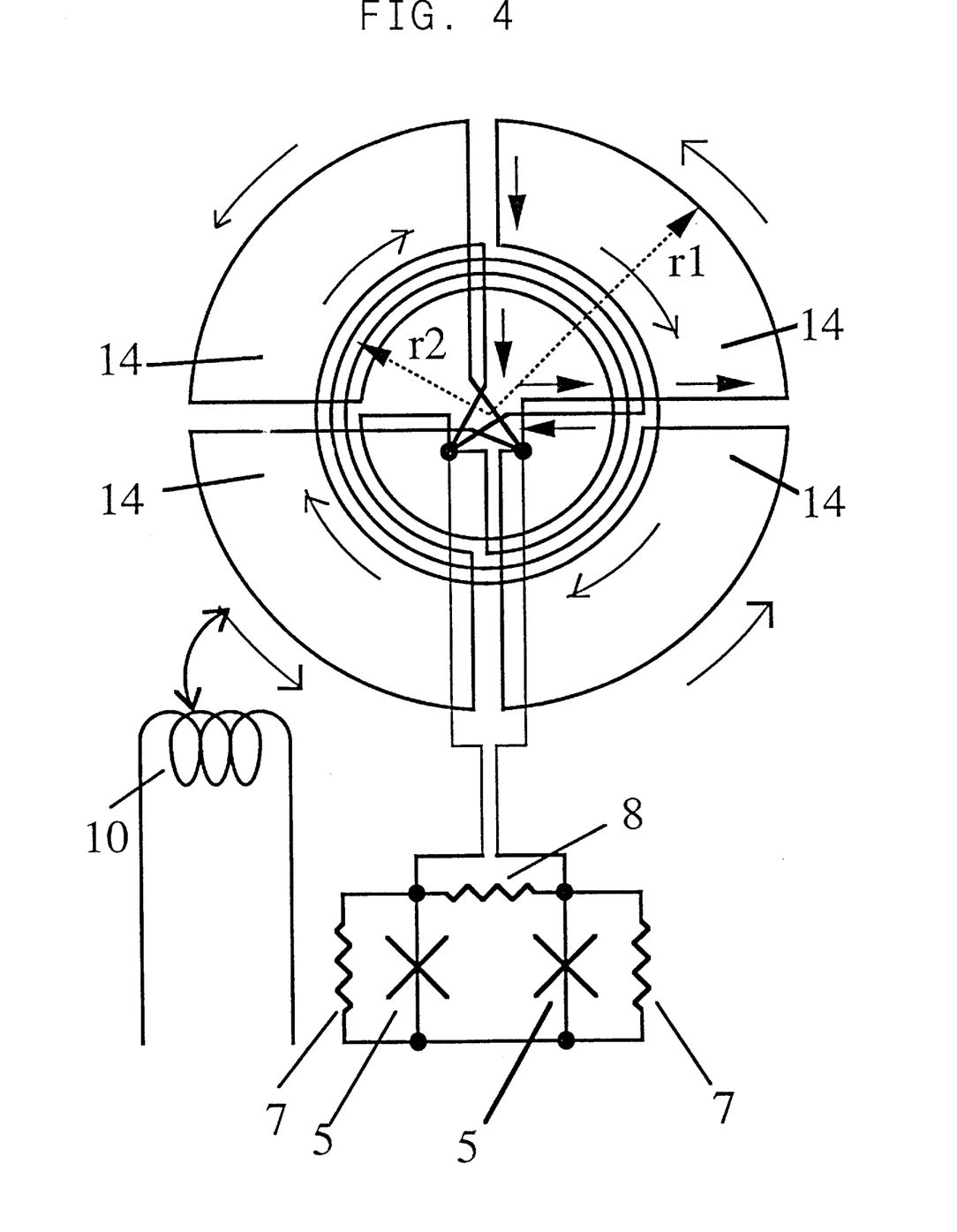
FIG. 4 is a configuration diagram of a radial differential SQUID magnetic flux meter illustrating a third embodiment of the present invention.
Figure 5:
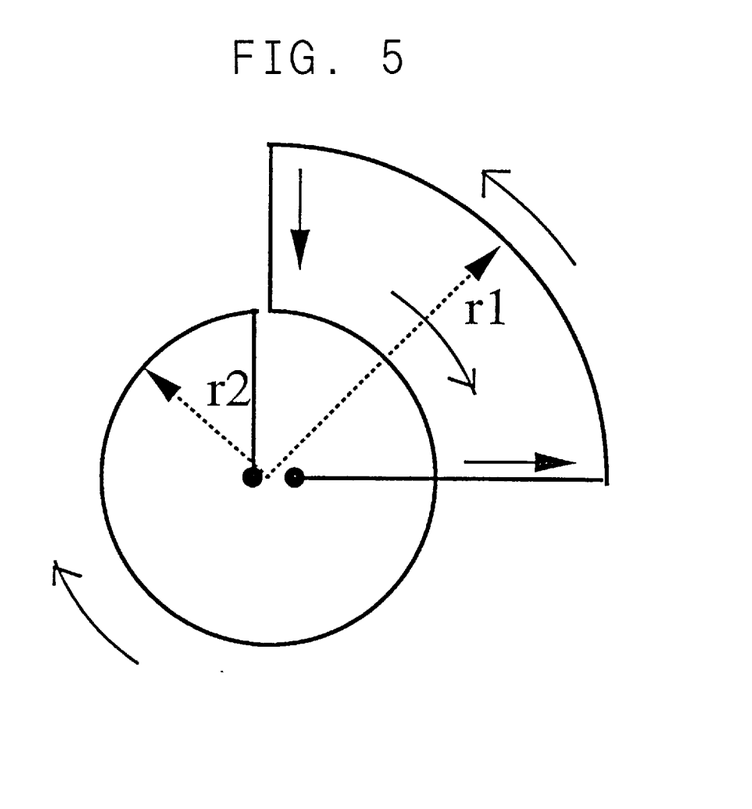
FIG. 5 illustrates loops forming the multi-loop shown in the third embodiment.

FIG. 4 is a configuration diagram of a radial differential SQUID magnetic flux meter illustrating a third embodiment of the present invention. The third embodiment also has a multi-loop structure wherein four loops are connected in parallel. As shown in FIG. 5, each of the loops that form the multi-loop is constituted by a sectoral loop having a radius $r_1$ and a circular loop having a radius $r_2$. They are designed so that their areas $\pi r_1^2 /4$ and $\pi r_2^2$ are equal to each other and are series-connected in opposite directions. Four pairs of the loops shown in FIG. 5 are arranged at an angular shift of 90°. As a result, the four sectors having a radius $r_1$ form a circle having a radius $r_1$, and four circles having a radius $r_2$ form four circles having a radius $r_2$ as shown in FIG. 4. Thus, there is provided a configuration equivalent to that of the washer coil of the first embodiment.

As is apparent from the above-described first through third embodiments, a washer coil formed to be used as a radial differential pick-up coil can have any configuration selected from among the configuration shown in FIG. 1, wherein a concentric circular loop is formed using only circular loops, the configuration shown in FIG. 2, employing sectoral loops only, and the configuration shown in FIG. 4, where in sectoral loops and circular loops (sectors having different central angles) are mixed.

Figure 6:
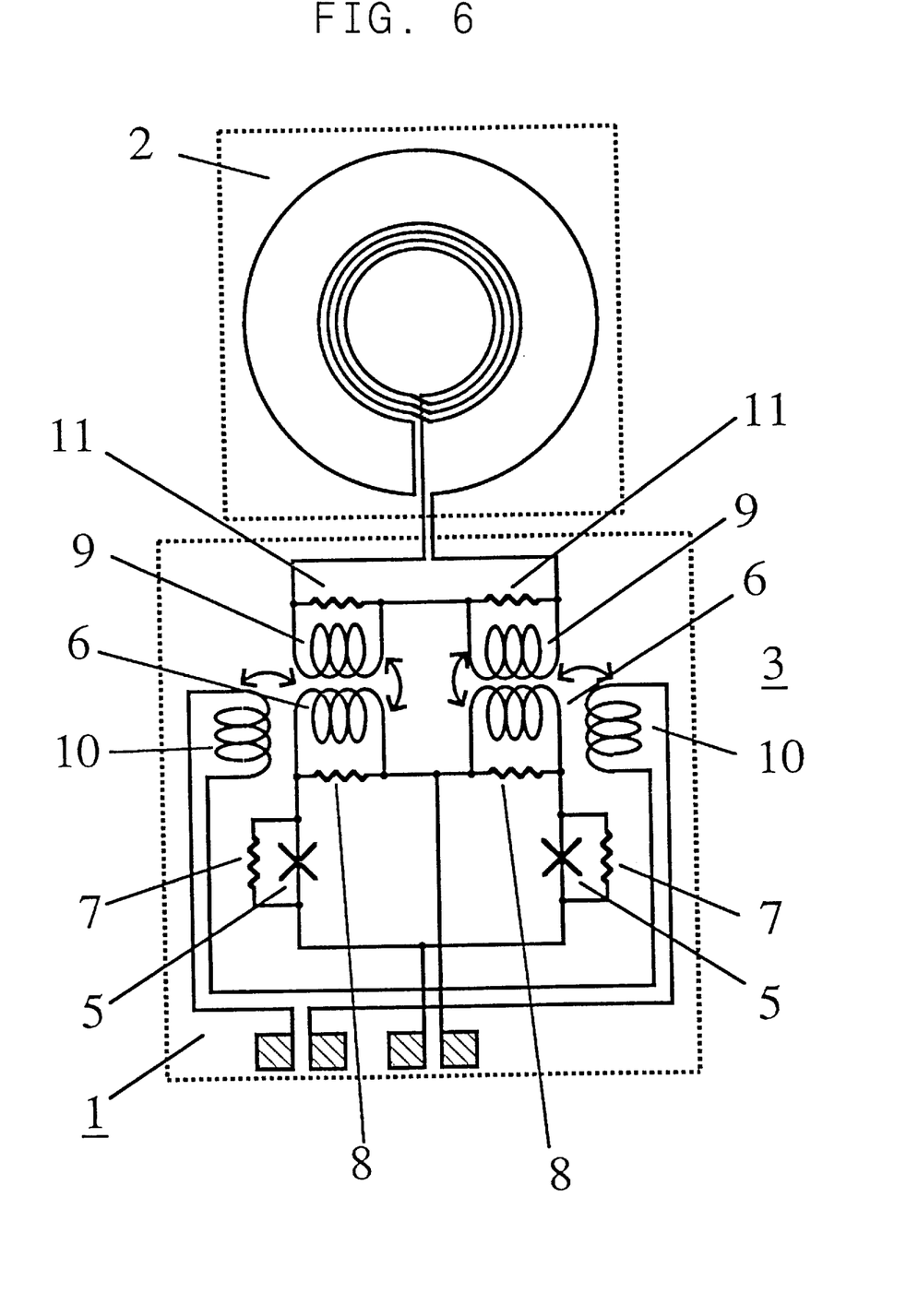
FIG. 6 is a configuration diagram of a radial differential SQUID magnetic flux meter illustrating a fourth embodiment of the present invention.

FIG. 6 is a configuration diagram of a radial differential SQUID magnetic flux meter illustrating a fourth embodiment of the present invention. In this embodiment, a pick-up coil is provided independently of a washer coil, and a planar radial differential pick-up coil 2 made up of a plurality of concentric circular loops and a SQUID 1 having an input coil 9 are integrated on the same substrate. A damping resistor 11 is connected across the input coil 9 in parallel to suppress unnecessary resonance at the input coil 9. The SQUID 1 is a DC SQUID having a double washer structure wherein two washer coils 6 are connected in series. This structure does not need a superconducting shield element because it allows the SQUID itself to be less susceptible to external magnetic fields. A sensor unit 3 is constituted by the SQUID 1 and the planar pick-up coil, which results in a compact configuration. The connecting portion between the input coil 9 of the SQUID 1 and the planar pick-up coil 2 has a micro strip line structure to reduce stray inductance and to prevent the invasion of a magnetic field in areas other than the magnetic field detection portion.

In the present embodiment, the pick-up coil 2 is again integrally formed on the same substrate having the SQUID 1 formed thereon using a thin film process. This makes it possible to provide a radial differential SQUID magnetic flux meter in which the sensor unit can be made compact and coil balance is improved and which can be easily produced on a mass production basis.

Figure 7:
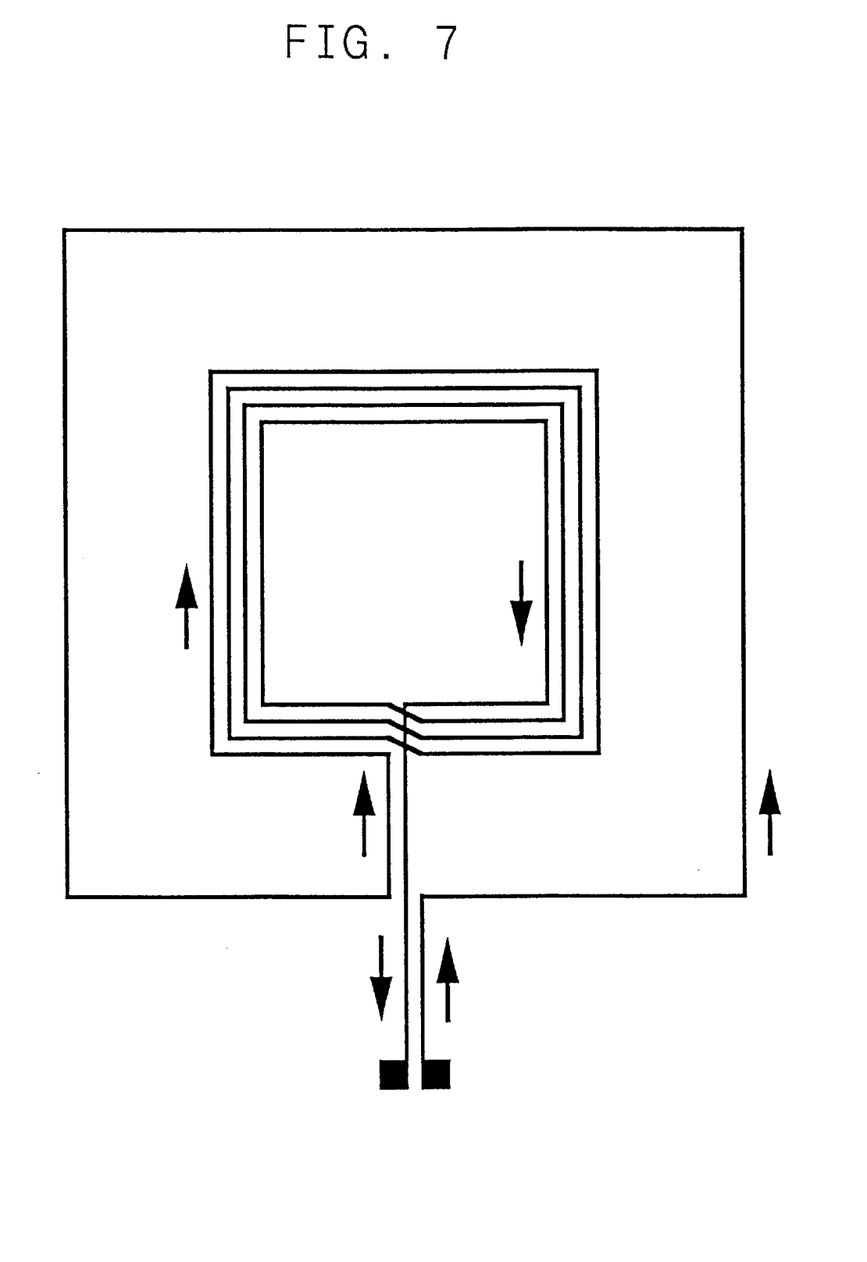
FIG. 7 shows an arrangement of a radial differential detection coil constituted by polygonal loops.

Although the magnetic field detection portions shown in the first, second, third, and fourth embodiments are in the form of concentric circles, as shown in FIG. 7, it is possible to employ polygonal loops having centroids in the same position which are coupled in opposite directions as in the case of the concentric circles and are designed to have equal effective areas. Such a polygonal loop may be configured by connecting a plurality of smaller polygonal loops in series or in parallel or may be configured as a combination of series connection and parallel connection.

Figure 8:
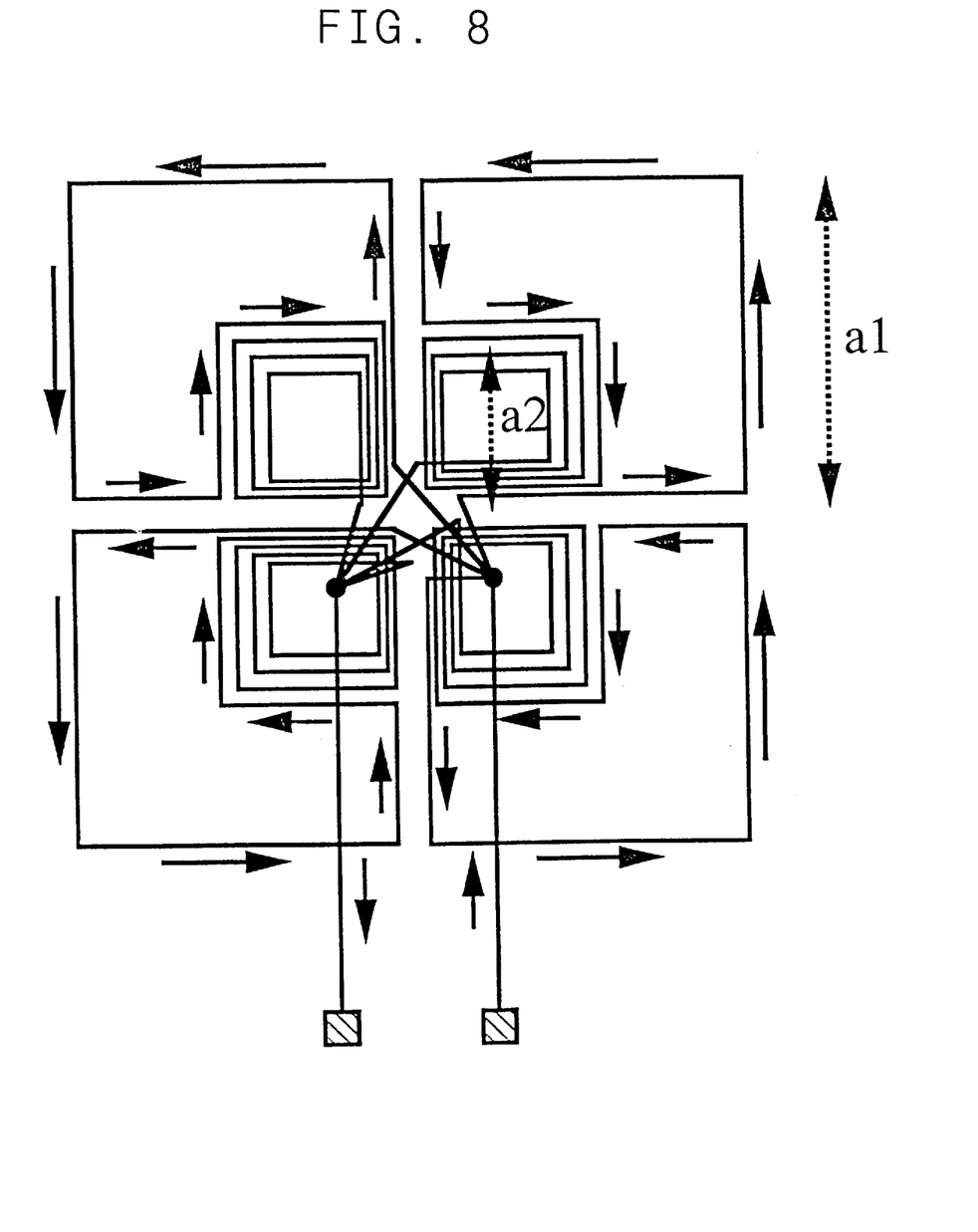
FIG. 8 shows an arrangement of a radial differential detection coil constituted by polygonal loops having a multi-loop structure.
Figure 9:
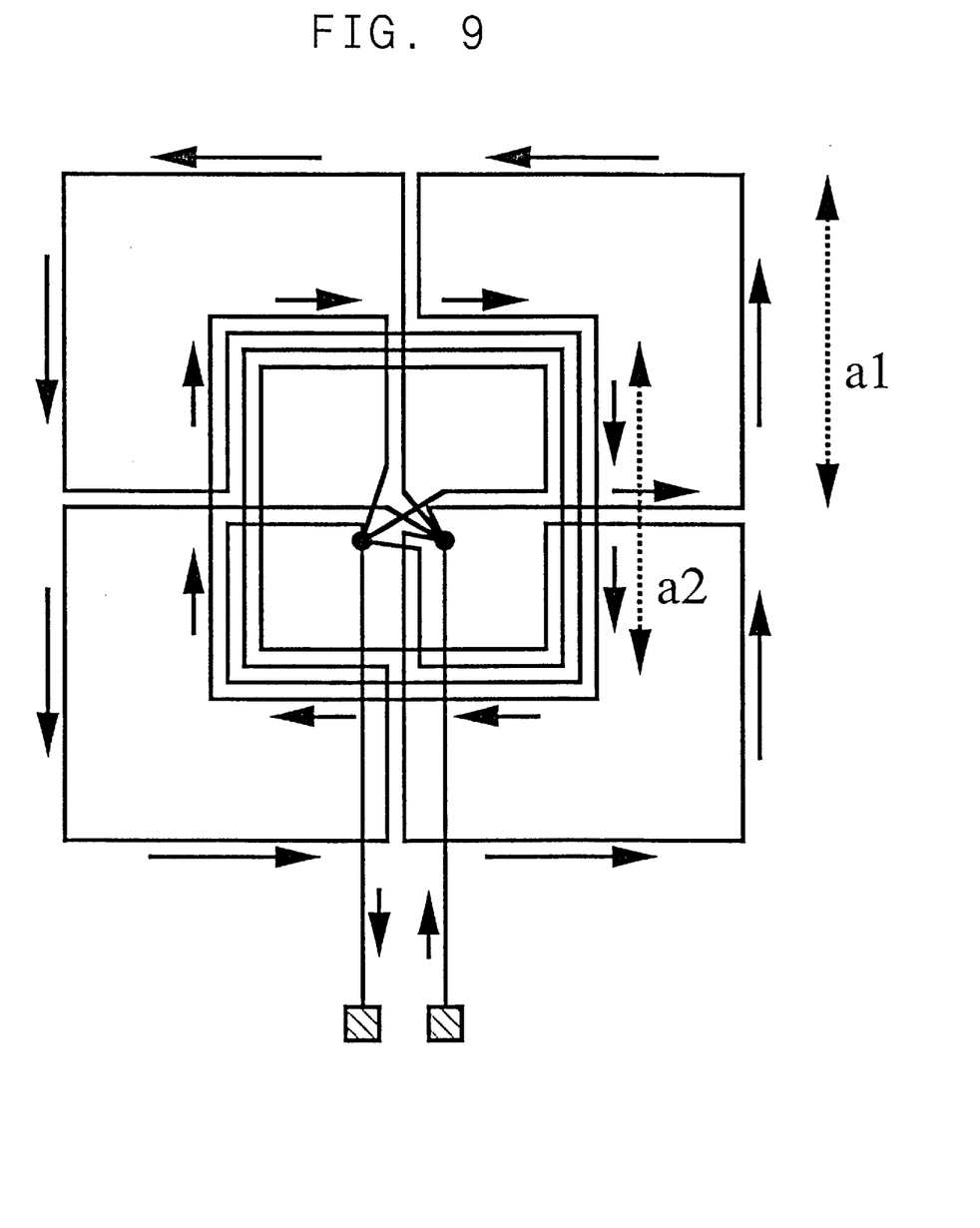
FIG. 9 shows an arrangement of a radial differential detection coil constituted by polygonal loops having a multi-loop structure.

FIG. 8 and FIG. 9 show coil arrangements of a radial magnetic field detection coil constituted by polygonal loops in a multi-loop structure wherein four loops are connected in parallel. In FIG. 8, a square loop one of whose sides is $a_1$ and a loop constituted by four squares one of whose sides is $a_2$ are series-connected in opposite directions, and four such combinations are connected in parallel. The ratio between the lengths of the sides is $a_1:a_2=2:1$. They collectively provide the same configuration as that of the radial differential detection coil constituted by polygonal loops as shown in FIG. 7.

In FIG. 9, four loops each constituted by a square one of whose sides is $a_1$ and a square one of whose sides is $a_2$ are connected in parallel. In this case, $a_1=a_2$.

In the above-described embodiments, a silicon single crystal substrate is used as the substrate, and various coils and lines are formed of superconducting Nb thin films. However, the present invention is not limited to the combination of the substrate and thin films as described above.

As described above, in a radial differential SQUID magnetic flux meter according to the present invention, since the magnetic flux detection portion is integrated on the same substrate as for the SQUID, the configuration of the sensor unit portion is simplified and spatial resolution is improved.

Further, since sensitivity to a magnetic field is improved, sufficient sensitivity can be obtained even if the area of the detection portion is reduced. It is therefore possible to provide higher spatial resolution.

In addition, since the accuracy of the balance of the detection coils is improved, external magnetic fields can be efficiently eliminated.

Since the sensor unit portion as a whole can be fabricated of a superconducting thin film, there are significant advantages such as improved productivity.

What is claimed is:

1. A superconducting quantum interference device magnetic flux meter for detecting a magnetic field and canceling a uniform component of the magnetic field and a first order differential component of the magnetic field, comprising: two Josephson junctions; a washer coil which in combination with the Josephson junctions forms a superconducting loop; and a feedback modulation coil magnetically coupled to the washer coil for receiving an output signal of the Josephson junctions; wherein the washer coil is formed by concentric loops disposed on a flat surface, and wherein the washer coil forms a magnetic field detection portion which directly detects a magnetic field.

2. A superconducting quantum interference device magnetic flux meter according to claim 1; wherein each of the concentric loops forming the magnetic detection portion comprises adjacent portions of a plurality of separate loops, the adjacent portions being physically arranged with respect to each other so as to form the equivalent of a single loon, and wherein the separate loops are connected in parallel to collectively form the equivalent of a plurality of concentric loops.

3. A superconducting quantum interference device magnetic flux meter according to claim 2;
wherein each of the adjacent portions of the plurality of separate loops has the shape of a sector of a circle such that each of the concentric loops has a substantially circular shape, the separate loops being arranged adjacent to each other such that the individual sectors of circles combine to substantially form a plurality of concentric circles.

4. A superconducting quantum interference device magnetic flux meter according to claim 1; wherein each of the concentric loops forming the magnetic detection portion comprises a plurality of separate loops, at least one of the separate loops has a first portion having a circular shape and a second portion having a sectorial shape, the separate loops being arranged such that the first portion of the at least one separate loop forms at least one first circle and the second portions thereof combine to substantially form at least one second circle, the first and second circles being concentric, and wherein the separate loops are connected in parallel to collectively form the plurality of concentric loops.

5. A superconducting quantum interference device magnetic flux meter according to claim 2; wherein each of the adjacent portions of the plurality of separate loops has a polygonal shape, such that each of the separate loops comprises a plurality of substantially polygonal-shaped loops, and the separate polygonal-shaped loops are arranged to form a plurality of substantially concentric polygonal-shaped loops having the same centroid.

6. A superconducting quantum interference device magnetic flux meter for detecting a magnetic field and canceling a uniform component of the magnetic field and a first order differential component of the magnetic field, comprising: two Josephson junctions; a washer coil which in combination with the Josephson junctions forms a superconducting loop; a feedback modulation coil magnetically coupled to the washer coil for receiving an output signal of the Josephson junctions; and a planar pick-up coil forming a magnetic field detecting portion, the planar pick-up coil comprising a plurality of concentric loops integrally formed on the same substrate as the Josephson junctions, the washer coil and the feedback modulation coil, each of the concentric loops comprising adjacent portions of a plurality of separate loops, the adjacent portions being physically arranged with respect to each other so as to form the equivalent of a single loop, the separate loops being connected in parallel with each other to form the equivalent of a plurality of concentric loops.

7. A superconducting quantum interference device magnetic flux meter according to claim 6; wherein each of the adjacent portions of the separate loops forming the magnetic field detection portion is in the form of a sector of a circle, and each of the respective separate loops has a plurality of portions in the form of a sector of a circle and are connected to each other such that the plurality of adjacent portions of the separate loops form the equivalent of a plurality of concentric circles.

8. A superconducting quantum interference device magnetic flux meter according to claim 6; wherein each of the adjacent portions of the separate loops forming the magnetic field detection portion is in the form of a polygonal-shaped loop, and each of the respective separate loops has a plurality of portions in the form of a polygon and are connected to each other such that the plurality of loops form the equivalent of a plurality of polygonal-shaped loops having centroids in the same position.

9. A magnetic flux meter for detecting a magnetic field, comprising: a pair of Josephson junctions; a washer coil coupled to the Josephson junctions to form a superconducting loop therewith; and a feedback modulation coil coupled to the washer coil for receiving an output signal of the Josephson junctions; wherein the washer coil comprises a plurality of concentric loops disposed on a planar surface and the washer coil directly detects a magnetic field such that a separate pick-up coil is not needed.

10. A magnetic flux meter according to claim 9; wherein each of the concentric loops forming the washer coil comprises adjacent portions of a plurality of separate loops which are connected to each other, the adjacent portions being physically arranged with respect to each other so as to function equivalently to that of a single loop, to thereby form the equivalent of concentric loops functioning equivalently as actual concentric ring-shaped loops.

11. A magnetic flux meter for detecting a magnetic field, comprising: a pair of Josephson junctions; a washer coil coupled to the Josephson junctions to form a superconducting loop therewith; a feedback modulation coil coupled to the washer coil for receiving an output signal of the Josephson junctions; and a planar pick-up coil forming a magnetic field detecting portion, the planar pick-up coil comprising a plurality of concentric loops having one of a circular or polygonal shape integrally formed on the same substrate as the Josephson junctions, the washer coil and the feedback modulation coil, each of the concentric loops comprising adjacent portions of a plurality of separate loops, the adjacent portions being physically arranged with respect to each other so as to form the equivalent of a single loop, to thereby form the equivalent of concentric ring-shaped loops functioning equivalently to that of actual concentric ring-shaped loops, the separate loops being connected in parallel with each other.

12. A magnetic flux meter according to claim 11; wherein the adjacent portions of the separate loops forming the magnetic field detection portion are in the form of sectors of circles and each of the separate loops are connected to each other such that the adjacent portions of the plurality of separate loops are arranged in the form of a plurality of concentric circles.

13. A magnetic flux meter according to claim 11, wherein the adjacent portions of the separate loops forming the magnetic field detection portion are in the form of polygonal-shaped loops and each of the separate loops are connected to each other such that the adjacent portions of the plurality of separate loops are arranged in the form of a plurality of polygonal-shaped loops having centroids in the same position.

* * * * *